(12) United States Patent
Huang

(10) Patent No.: US 6,825,078 B1
(45) Date of Patent: Nov. 30, 2004

(54) SINGLE POLY-SI PROCESS FOR DRAM BY DEEP N WELL (NW) PLATE

(75) Inventor: Jenn-Ming Huang, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/444,875

(22) Filed: May 23, 2003

(51) Int. Cl.[7] .................. H01L 21/8242; H01L 27/108
(52) U.S. Cl. ............... 438/242; 438/238; 438/239; 438/243; 438/386; 257/296; 257/301; 257/302; 257/305
(58) Field of Search ................. 438/242–244, 438/248, 249, 238–239, 386, 303, 399, 159; 257/296, 305, 300–304

(56) References Cited

U.S. PATENT DOCUMENTS

| | | | |
|---|---|---|---|
| 4,907,047 A | 3/1990 | Kato et al. ................. 357/23.6 |
| 5,185,284 A | 2/1993 | Motonami .................... 437/52 |
| 5,208,657 A | 5/1993 | Chatterjee et al. .......... 257/302 |
| 5,574,621 A | 11/1996 | Sakamoto et al. ....... 361/321.1 |
| 5,793,075 A | 8/1998 | Alsmeier et al. ........... 257/296 |
| 6,037,620 A | 3/2000 | Hoenigschmid et al. .... 257/296 |
| 6,177,697 B1 | 1/2001 | Cunningham ............... 257/301 |

Primary Examiner—Donghee Kang
(74) Attorney, Agent, or Firm—Thomas, Kayden, Horstemeyer & Risley

(57) ABSTRACT

A method for forming, within a double well formation, an array of DRAM memory cells isolated from each other by shallow trench isolation (STI), each cell comprising a MOSFET access transistor and a storage trench capacitor. A top plate of said capacitor is the trench wall within a deep N-well portion of the double well and the bottom plate is formed of a doped polysilicon layer within the trench, which layer is partially separated from the trench sidewalls by a dielectric layer whose upper portion is removed to allow the formation of a autodiffused doped channel between said polysilicon plate and the source region of the access transistor. The method uses a single dielectric layer deposition to serve as both a gate a gate dielectric for the MOSFET and a capacitor dielectric and requires only a single deposition of polysilicon to serve as both the transistor gate electrode and a capacitor plate.

16 Claims, 9 Drawing Sheets

SINGLE POLY-SI PROCESS FOR DRAM BY DEEP N WELL (NW) PLATE

BACKGROUND OF THE INVENTION

1. Field of the Invention

This invention relates generally to the fabrication of dynamic random access memories (DRAM's), particularly such memories in which the memory storage device is a deep trench capacitor and wherein individual memory cells are electrically isolated from each other by isolation trenches.

2. Description of the Related Art

Typical dynamic random access memories (DRAM's) consist of densely packed arrays of memory cells which are themselves comprised of a charge storage device coupled to a charge accessing device. The charge storage device is usually a capacitor and the accessing device is usually a single MOS field effect transistor (MOSFET). The transistor can be connected at its source to one plate of the storage capacitor, at its drain to a conducting bit line and at its gate electrode to a conducting word line. In a normal operation in which a 1 or a 0 is written on or read from a particular memory cell, the particular cell is selected by choosing the appropriate pair of intersecting word and bit lines. Applying a given potential to the word line turns on the access transistor and a given charge applied to the bit line will then be deposited on the capacitor plate and stored. Conversely, during reading, the word line again activates the transistor and this time the presence of the charge in the capacitor is sensed by appropriate circuitry and identified as a 1 or 0.

A major problem associated with the design of increasingly dense arrays of memory cells is the necessity of decreasing the surface area of the storage capacitors while not decreasing their capacitance. Chatterjee et al. (U.S. Pat. No. 5,208,657) describes the difficulties of using planar capacitors as storage units in a DRAM module having a 5 volt power supply. Such a capacitor would require a capacitance of approximately 50 femtofarads (fF) and, in consequence, a capacitor area of approximately 20 square microns. Not only is this area overly large for the most densely packed circuits, but it presents an unacceptably vulnerable target for alpha particles which are a causal mechanism for soft error rates (SER). Chatterjee discloses the use of a trench capacitor, which is a capacitor formed in a trench or cavity that extends vertically into the substrate of the integrated circuit that can be produced by a variety of etching mechanisms. Such capacitors gain plate area and, hence, capacitance, through an increased vertical extension rather than by horizontal extension. One plate of such a capacitor is defined by the surface of the inner wall of the doped region of the substrate within which the trench is formed. Although this inner wall forms the plate boundary, charge can in fact also be stored within a depletion region formed beneath the wall surface and extending into the doped substrate. The other plate of the capacitor, which can also be a storage plate, is a conductive core that is deposited within the trench. An oxide layer is first formed over the inner trench wall to serve as a dielectric medium and to insulate one plate from the other. The prevalence of such trench capacitors within the practice of the prior art is illustrated by the work of Kato et al. (U.S. Pat. No. 4,907,047), which teaches a method of forming a memory cell comprising a storage capacitor having a first electrode formed in the side and bottom wall portions of a primary cavity and having a second electrode formed over a dielectric film which covers said first electrode. Motonami (U.S. Pat. No. 5,185,284) describes a "groove" type capacitor (which is essentially a trench capacitor) which is circumscribed by a second capacitor to increase the overall capacitance of the combination. Cunningham (U.S. Pat. No. 6,177,697) describes a trench capacitor partially surrounded by a shallow trench isolation region (STI). The substrate is then doped through the inner surface of the trench capacitor, which is then lined with an oxide and filled with a polysilicon core to form a capacitor plate. A second capacitor plate is formed by the doped surface of the inner wall of the capacitor trench. Alsmeier et al. (U.S. Pat. No. 5,793,075) describes a deep trench capacitor within a lightly doped substrate wherein an inversion layer beneath the trench serves as one plate. Sakamoto et al. (U.S. Pat. No. 5,574,621) discloses a trench capacitor in which a plurality of conductor filled trenches connected by a conducting layer comprise a single bottom electrode and a second conducting layer, disposed over a dielectric layer, comprises a top electrode. Hoenigschmid et al. (U.S. Pat. No. 6,037,620) discloses a DRAM cell comprising a shallow isolation trench (STI), a storage trench capacitor partially overlaid by the STI and an access IGFET transistor connected to the perimeter of the capacitor by a conduction path that utilizes a buried strap interconnection.

The need to increase the density of memory cells and to integrate them with logic devices leads to complex fabrication processes. In particular, the fabrication of large DRAM arrays is complicated by a plurality of dielectric layer depositions to form gate and capacitor dielectrics and polysilicon depositions which are necessary to form the word and bit line connections to each cell and to provide connections between the access transistors and their associated storage capacitors. Even with the use of trench capacitors to reduce surface areas, the spacing between capacitors is limited by charge diffusion considerations. It is the purpose of the present invention to provide a method of isolating densely packed memory cells from each other while doing so in an efficient and cost effective manner that focuses on the minimization of dielectric and posysilicon depositions. In particular, the novel approach of forming the trench capacitor and the access transistor within a double well in which an isolation trench has already been formed provides an efficient method for forming cell plate connections having advantageous resistance properties.

SUMMARY OF THE INVENTION

A first object of this invention is to provide a method for forming one or a plurality of densely packed dynamic random access memory (DRAM) cells that can be efficiently and cost-effectively integrated with associated logic circuitry.

A second object of this invention is to provide such single or integrated DRAM cells that are characterized by low noise and soft error rates (SER).

A third object of this invention is to provide a method for forming one or a plurality of DRAM cells with high storage capacitance and low cell area.

A fourth object of this invention is to provide a method for forming DRAM cells and circuitry which can be diminished in dimension to levels exceeding that required by the 0.18 micron generation of devices and beyond.

A fifth object of this invention is to provide a method for forming such DRAM cells that produces a low cell plate connection resistance.

A sixth object of this invention is to provide a method for forming a DRAM memory cell that can be independently biased.

In accord with the objects of this invention there is provided a method for forming a single DRAM memory cell or an array of such DRAM memory cells in a semiconductor substrate. Each such cell includes a trench capacitor as a charge storage mechanism having a high capacitance and small surface area, a MOSFET as the accessing mechanism for storing and retrieving charge from the storage capacitor and a shallow isolation trench (STI) for electrically isolating one cell from another. Further in accord with the objects of this invention there is provided a method for forming the isolation trench, the capacitor and the transistor within a double well structure formed in the substrate, said well structure comprising a relatively shallow doped well of a first dopant type (the upper well) formed within a deeply implanted doped well of a second dopant type (the lower well). The isolation trench is contained within the upper well. The capacitor trench extends through the upper well and terminates within the lower well, wherein the trench bottom and the portion of its inner sidewall surface within said lower well forms one capacitor plate (a top plate) and the well itself provides a low resistance connection to said plate. A preferred embodiment of this invention discloses a double well which is a relatively shallow P-well substantially contained within a deep N-well formed in a silicon substrate. Further in accord with the objects of this invention, when more than one storage capacitor is to be formed within the same well structure in forming an array of memory cells, there is provided a method for separating the trench capacitors of neighboring memory cells by the formation of shallow trench isolation (STI) regions within the well structure. Yet further in accord with the objects of this invention, there is provided a method of forming the trench capacitor so that a substantial portion of the sidewalls and the bottom of the capacitor trench lie within the lower well, said portions thereby forming the top plate of the capacitor, while the bottom plate of said capacitor is formed by the deposition of a conducting layer which completely fills the interior of the trench, but is separated from the interior surface of the trench sidewall by a dielectric layer which contacts all regions of the trench sidewalls and base except a region within the upper well from which the dielectric layer has been removed and which the bottom plate thereby contacts electrically. Within the preferred embodiment, the conducting layer is a layer of doped polysilicon. Yet further in accord with the objects of this invention there is provided a method of forming an access transistor of the MOSFET type immediately adjacent to the trench capacitor, the gate electrode of said transistor being formed on a gate dielectric layer over the substrate surface above the double well and the source and drain of said transistor being formed beneath the gate electrode within the upper well of the double well formation and said transistor advantageously making direct electrical contact with the bottom plate of the trench capacitor by means of an doped region, autodiffused from the doped polysilicon bottom plate, that contacts said bottom plate through an upper region of the interior trench wall surface from which the dielectric layer has been removed. Still further in accord with the objects of this invention and to facilitate fabrication of said memory cells in an efficient and cost effective manner, there is provided a method of forming both the bottom capacitor plate, which is the conducting layer filling the trench, and the gate electrode and word line of its access transistor, using a single deposition of a conducting material, which is doped polysilicon in the preferred embodiment. Further in accord with the objects of the present invention there is provided a method of forming said DRAM structures while employing a single oxide growth process to form both the transistor gate oxide and the capacitor dielectric layer. Still further in accord with the objects of this invention there is provided a method of forming said DRAM structures and associated circuitry while using a minimum number of photolithography masking steps.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein:

The figures illustrate the formation process in a series of steps according to the method of the invention. FIG. 11 shows the completed fabrication as covered by an interlayer dielectric (ILD) with metallization thereon and contact formation therein.

DESCRIPTION OF THE PREFERRED EMBODIMENTS

The present invention provides an efficient and cost effective method for forming a single DRAM memory cell or an array of such cells, electrically isolated from each other by shallow trench isolation, within a double well formation in a semiconductor substrate. In the preferred embodiment of the present invention, each cell is formed in a silicon substrate and each cell comprises an isolation trench, a MOSFET used as an access transistor, and a trench capacitor used as a storage mechanism. Within the preferred embodiment, the memory cell is formed within a double well structure, comprising an upper well, which is a P-well, substantially contained within a lower well, which is a deep N-well. The access transistor is a MOSFET whose source and drain regions are formed within the upper well, while the trench capacitor extends through the P-well into the deep N-well, within which N-well its sidewalls and bottom surface form one of its two plates (the top plate). The sidewalls and bottom of the capacitor trench are conformally covered by a dielectric layer with the exception of a small region of the sidewall within the upper well, from which a portion of the dielectric layer is removed so as to expose the sidewall surface.

The second capacitor plate (the bottom plate) is formed of a layer of conducting material, N-doped polysilicon in the preferred embodiment, which fills the dielectric coated interior of the trench and is also used to form the gate electrode of the accessing transistor. The transistor is electrically connected to the capacitor through an autodoped channel formed between the bottom plate of the capacitor, where it contacts the exposed portion of the sidewall surface, and the source of the transistor. When more than one such cell is formed within the same double well, adjacent cells are isolated from each other by shallow trench isolation (STI) within the upper well of the double well.

Figure 1:
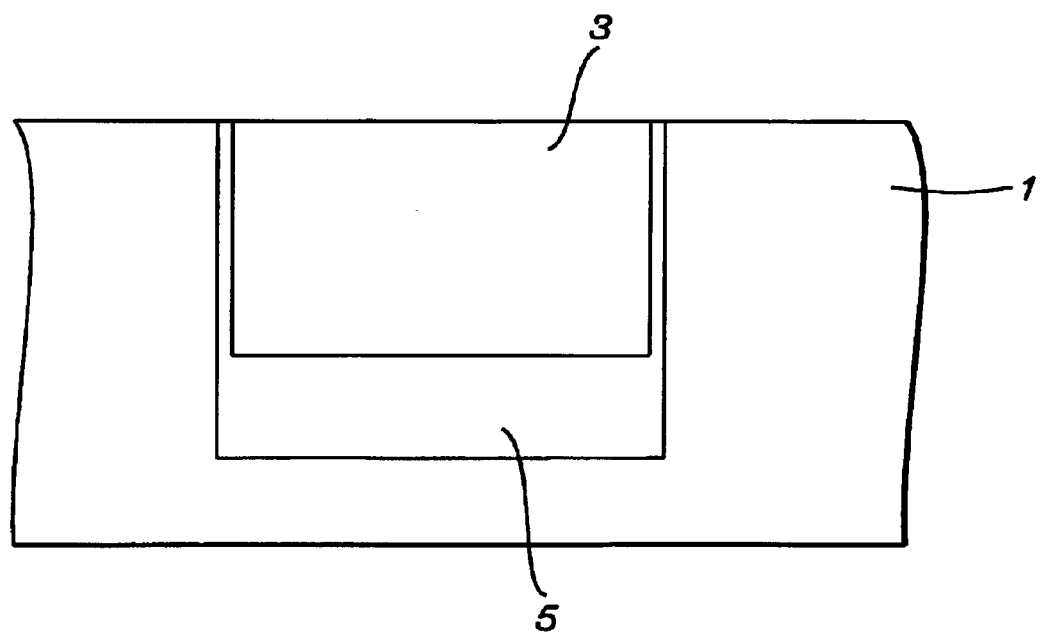
FIGS. 1 through 5 are schematic cross-sectional representations of the formation of a single DRAM memory cell comprising a P-channel type MOSFET access transistor and a storage trench capacitor.

Referring first to FIG. 1, there is shown a schematic cross-sectional representation of the first steps in the formation of a single DRAM memory cell in accord with the objects and methods of this invention. There is seen a semiconductor substrate (1), which in this embodiment is a silicon substrate of P-type conductivity, wherein a shallow trench (2) for isolation purposes has first been formed. The shallow trench is formed by masking and etching processes well known in the art and it is then filled with oxide and its upper surface is rendered co-planar with the substrate surface by a method such as chemical/mechanical polishing (CMP). Subsequent to the shallow trench formation a double well is formed within the substrate. The double well comprises a deeply implanted well (5), which is a region of the substrate deeply ion-implanted with dopant ions of one conductivity type, within which is formed a shallower well (3), which is a less deeply ion-implanted region with dopant ions of another conductivity type and which is substantially contained within the deeper well. In this embodiment, the double well comprises a shallow P-well (3) formed within a deep N-well (5), wherein the N-well is formed by a high energy (approximately 2–3 MeV) implant of N-type $P_{31}$ ions at a dosage of approximately $10^{12}$–$10^{13}$ ions/cm$^2$ and wherein the P-well is formed by a lower energy (approximately 100–200 keV) implant of P-type $B_{11}$ ions at a dosage of approximately $10^{12}$–$10^{13}$ ions/cm$^2$. The resulting ion densities within both the P and N wells is between approximately $10^{16}$ and $10^{18}$ ions/cm$^3$. As is evident in the figure, the shallow isolation trench (2) is substantially contained within the upper well (3).

Figure 2:
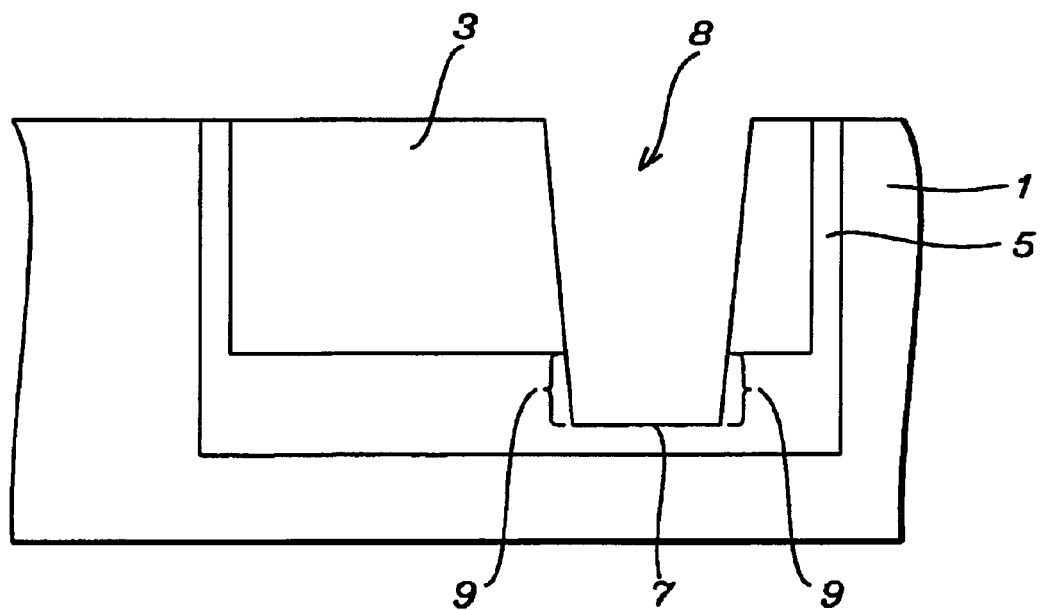

Referring next to FIG. 2, there is shown a continuation of the fabrication of FIG. 1 wherein a trench (8) for a capacitor has been etched into the double well so as to pass through the full vertical extent of the P-well and terminate within the deep N-well, with the bottom of the trench (7) and a substantial portion of the trench sidewalls (9) being within said N-well. This trench will eventually form the storage capacitor of the memory cell. The method for etching such a trench is well known in the art, so the photolithography and masking process has not been shown. However, it is to be noted that the etching process should be of a high etch selectivity relative to the oxide already deposited within the STI trench and, furthermore, the capacitor trench itself can be self-aligned to the STI trench so that it will be at least partially surrounded by said STI trench and electrically isolated from another capacitor subsequently formed in an adjacent cell. The formation of such an additional capacitor will be illustrated in FIGS. 7–11.

The bottom of the capacitor trench (7) and the portion of its sides (9) within the N-well will ultimately form a top plate of the storage capacitor for the memory cell and the N-well itself will provide a highly conductive connection to said plate. The portion of the capacitor trench within the upper well will be electrically isolated from the adjacent access transistor by a dielectric layer at the completion of the process and it will be isolated by the isolation trench from any adjacent capacitors subsequently formed.

Figure 3A:
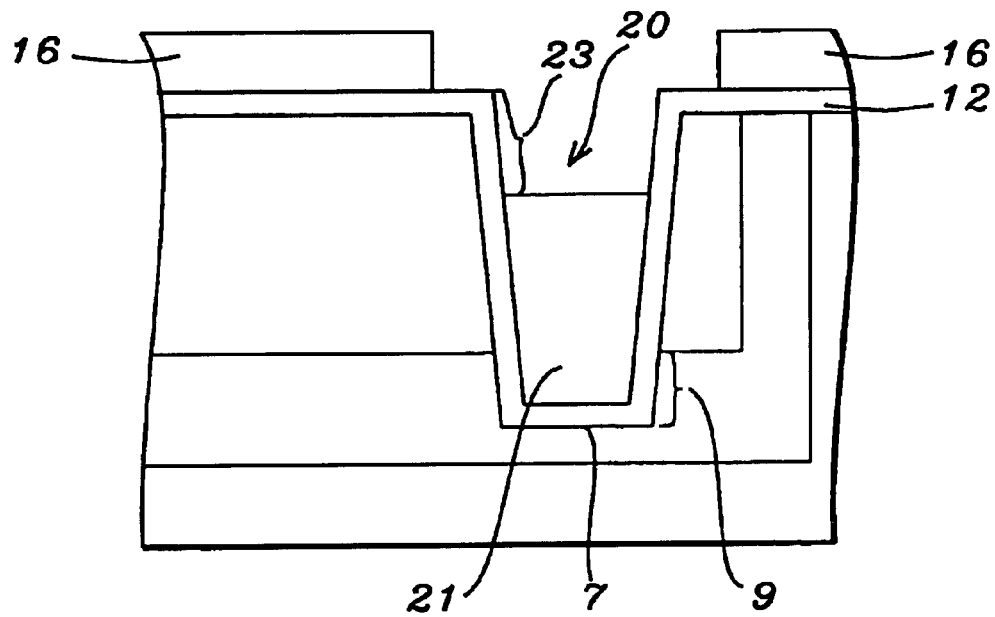
Figure 3B:
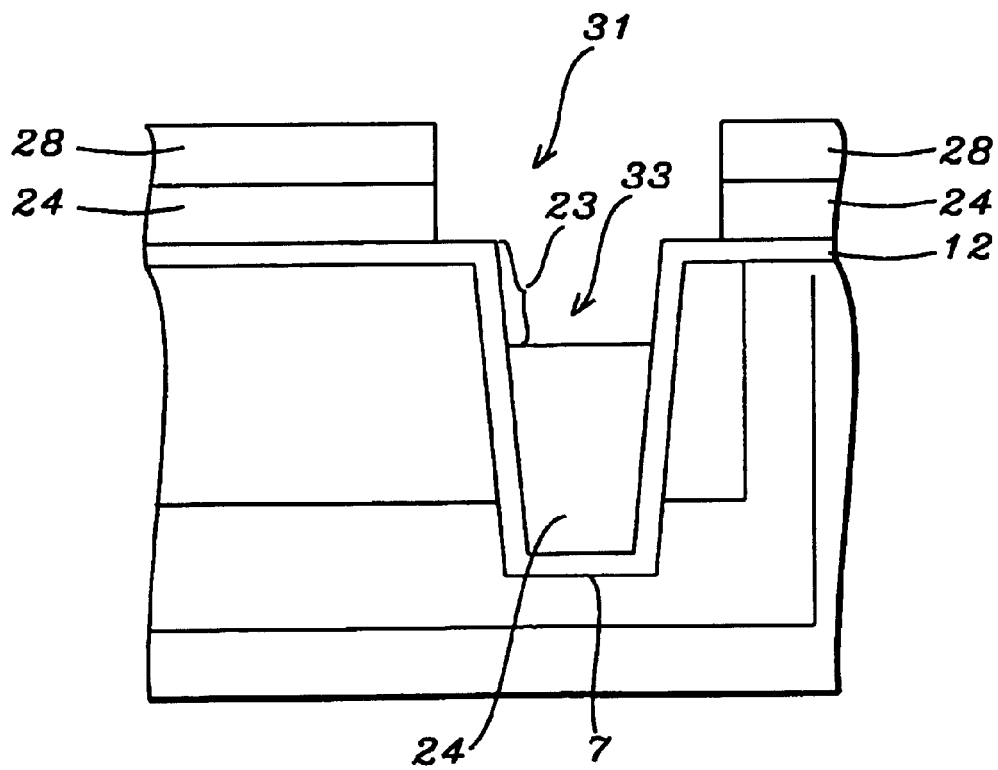

Referring next to FIG. 3a, there is shown a schematic drawing of the fabrication of FIG. 2 wherein a dielectric layer, which in this embodiment is in the form of an oxide (12) has now been formed to conformally cover at least the upper surface of the substrate over the double well and also the sidewalls and bottom of the trench to a thickness of between approximately 30 and 100 angstroms. The portion of the oxide layer residing on the upper surface of the substrate will ultimately serve as a gate oxide for the gate of the access transistor which will be subsequently formed adjacent to the capacitor, whereas the portion of the oxide residing on the sidewall (9) and bottom (7) of the trench will serve as a capacitor dielectric to separate the two capacitor plates. A layer of photosensitive material (16), such as a photoresistive material, has then been conformally deposited over all surfaces of the gate oxide (including those within the trench), whereafter a partial exposure and development of said photosensitive material has allowed the removal of a portion of said material above said trench opening (20), leaving a portion still remaining within said trench (21). The partial removal of said photosensitive material within the trench exposes, thereby, a portion of the capacitor dielectric (23) covering an upper portion of the trench wall, allowing said portion to be subsequently removed. The removal of this portion of the capacitor dielectric is an important part of the present invention since it will eventually allow the formation of a direct and efficient contact between the source of the access transistor and the capacitor plate within the trench and permits the access transistor and capacitor to be in close proximity to each other. An alternative method of exposing gate oxide on the upper portion of the capacitor trench is shown in the schematic drawing of FIG. 3b, wherein a layer of bottom anti-reflective coating (BARC), an organic photosensitive medium, is first applied (24) over the substrate surface so as to also fill the capacitor trench (27). A layer of a second photosensitive medium (28) is then deposited over the BARC, the second medium being capable of exposure by radiation of a frequency that does not expose the BARC. The second medium is then exposed and removed over the trench opening (31) and the BARC is partially etched back (33) by an $O_2$ dry etch, to expose an upper region of the dielectric layer covering the trench walls (23).

Figure 4:
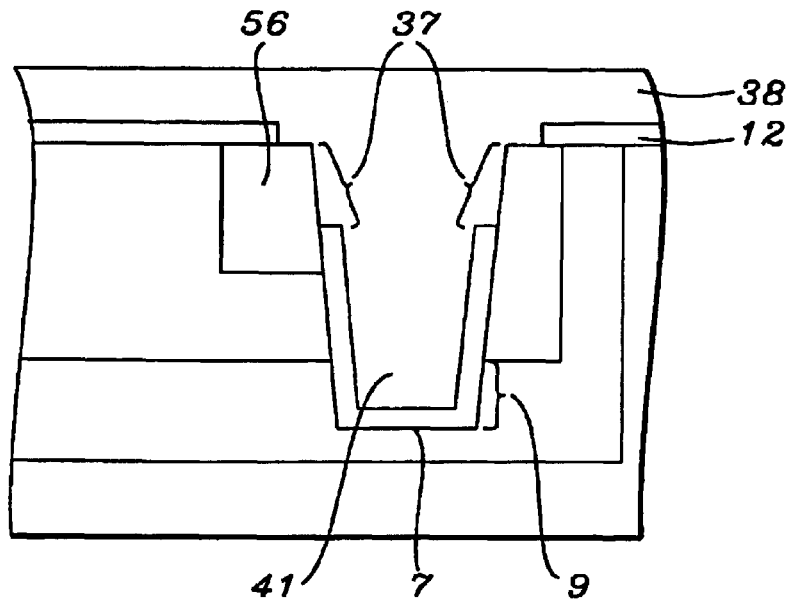

Referring now to FIG. 4, there is shown a schematic illustration of the fabrication of FIG. 3a wherein the exposed dielectric layer over the upper wall ((23) in FIG. 3a) of the trench has been etched away (37), the remaining photosensitive layer has been removed and a layer of conductive material, which in this embodiment is an N-type doped polysilicon layer (38), typically doped with $P_{31}$ ions to a density between approximately $10^{19}$–$10^{20}$ ions/cm$^3$, has been conformally deposited to a thickness of between approximately 1000 and 5000 angstroms over the gate oxide (12), filling the trench completely (41). It is to be noted that the layer makes electrical contact with the substrate at (37), the region from which the capacitor dielectric has been removed. It is further noted that N-type dopant from the polysilicon diffuses into the substrate (56) to form an autodoped conducting channel which will ultimately connect to the source of the access transistor. Although similar doping (not shown) will extend from the other side of the capacitor, it will be blocked by the isolation trench (2). It is a significant advantage of the method of this invention that this single polysilicon layer (38) will serve both as a bottom plate for the capacitor, whose top plate is formed by that portion of the sidewalls and bottom of the trench within the deep N-well, and also to form the gate electrode for the access transistor. The polysilicon layer may be smoothed by a method such as chemical mechanical polishing (CMP) to facilitate a subsequent interlayer dielectric deposition.

Figure 5:
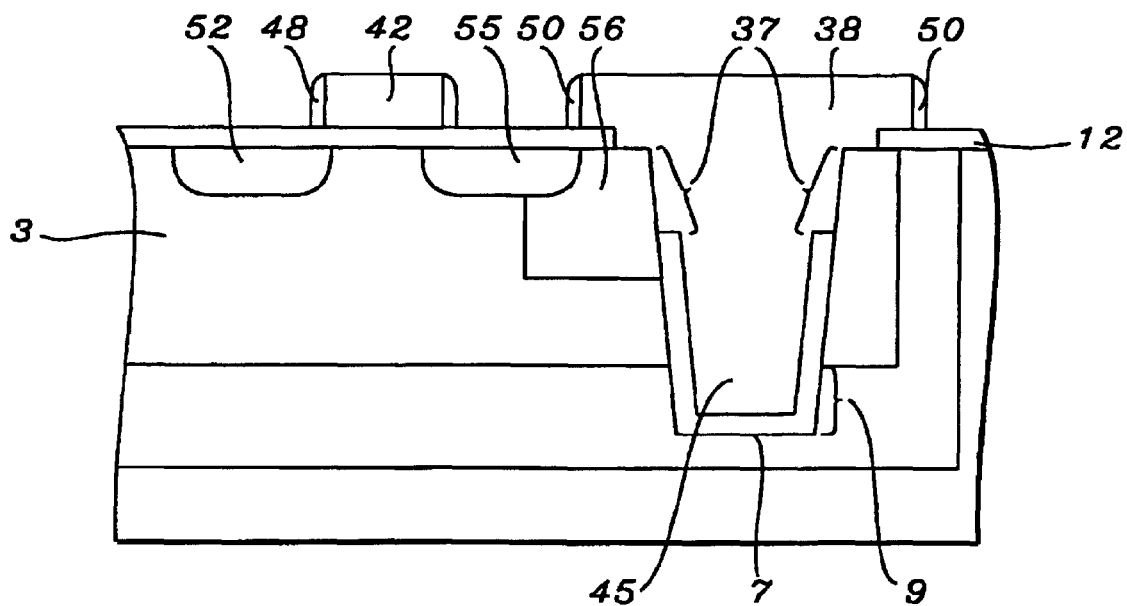

Referring now to FIG. 5, there is shown a schematic drawing of the fabrication of FIG. 4 wherein said polysilicon layer ((38) in FIG. 4) has been patterned and etched by a photolithography process (not shown) to produce a gate electrode and word-line formation (42) for the access transistor of the memory cell and to complete the bottom plate formation of the trench capacitor (45). The gate electrode and word-line polysilicon formation (42) has been provided with lateral insulating spacers (48) and the polysilicon capacitor bottom plate (45) has been similarly provided with lateral spacers (50). An adjacent access MOSFET type transistor has been formed in the shallow portion of the double well beneath the gate electrode (42) by the implantation of N-type lightly doped drain (NLDD) (52) and source (55) regions doped with an ion implant density of between approximately $10^{13}$ and $10^{14}$ cm$^{-2}$. The source (55) of said transistor is electrically connected to the polysilicon bottom plate (45) of the storage capacitor through the heavily N-doped capacitor contact (56) which is doped by autodiffusion from the polysilicon capacitor bottom plate (45) to an ion density of approximately $10^{19}$–$10^{20}$ cm$^{-3}$. Although it is not shown herein, electrical contacts to the drain of the transistor will eventually form the bit line to access the memory cell.

The advantages inherent in the method of forming the memory cell just discussed are further extended when a plurality of such cells are formed as in forming a DRAM array. Following, therefore, is a description of the use of the preceding method to form at least a pair of memory cells within the same double well wherein electrical isolation of the two trench capacitors is achieved by means of shallow trench isolation.

Figure 6:
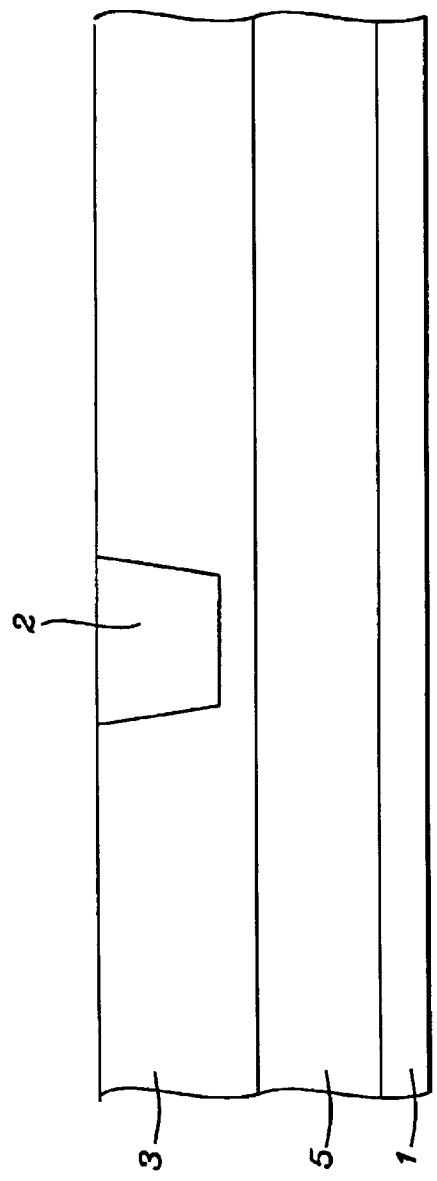
FIGS. 6–11 are schematic cross-sectional representations of the formation of a pair of DRAM memory cells isolated from each other by shallow trench isolation.

Referring to FIG. 6, there is shown a schematic cross-sectional representation of the first stage of the formation of a pair of adjacent DRAM memory cells within a silicon substrate (1), wherein a a shallow trench isolation (STI) region (2) has first been formed, filled with oxide and rendered coplanar with the substrate surface by a method such as chemical-mechanical polishing. Following the STI formation, a double well (as in FIG. 1) has been formed, comprising an upper P-well (3) formed within a deep N-well (5), the shallow trench isolation (STI) region (2) now being disposed within the P-well to electrically isolate the two trench capacitors that have yet to be formed. The method of forming each of the trench capacitors is essentially identical and is also the method applied in the formation of a single memory cell previously described with reference to FIGS. 1–5. The formation of two adjacent cells is shown to particularly point out the use of STI to separate the storage capacitors of the two adjacent cells.

Figure 7:
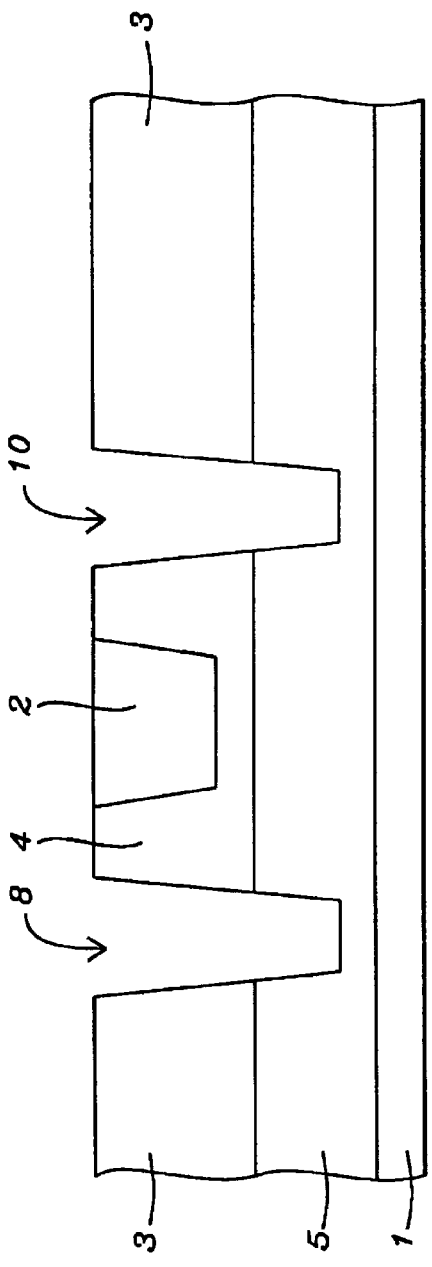

Referring next to FIG. 7, there is shown a continuation of the fabrication of FIG. 6 wherein a pair of capacitor trenches (8) & (10) have been etched into the substrate on either side of the STI so as to pass through the vertical extent of the P-well and terminate within the deep N-well, with the trench bottom and a substantial portion of the trench sidewall being within said N-well. Since the method for etching said trenches is well known in the art, the photolithography and masking process has not been shown. The sidewalls and bottoms of these trenches within the N-well will ultimately form the top plates of the storage capacitors for the two adjacent memory cells and the N-well itself will provide an efficient method of making electrical connection to all capacitor top plates. It is stressed that the method of forming the two trenches and of completing the formation of the capacitors is the same as that disclosed in FIGS. 1–5 and discussed above.

Figure 8A:
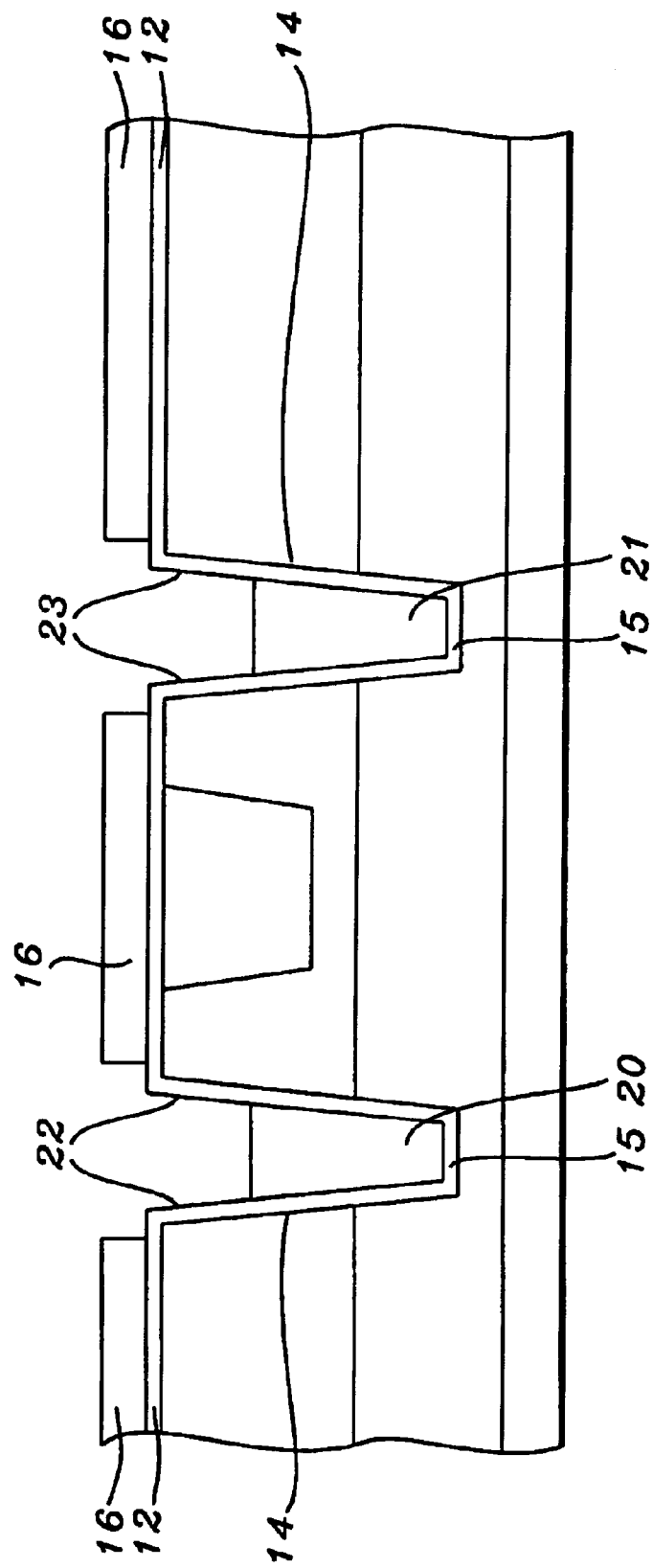
Figure 8B:
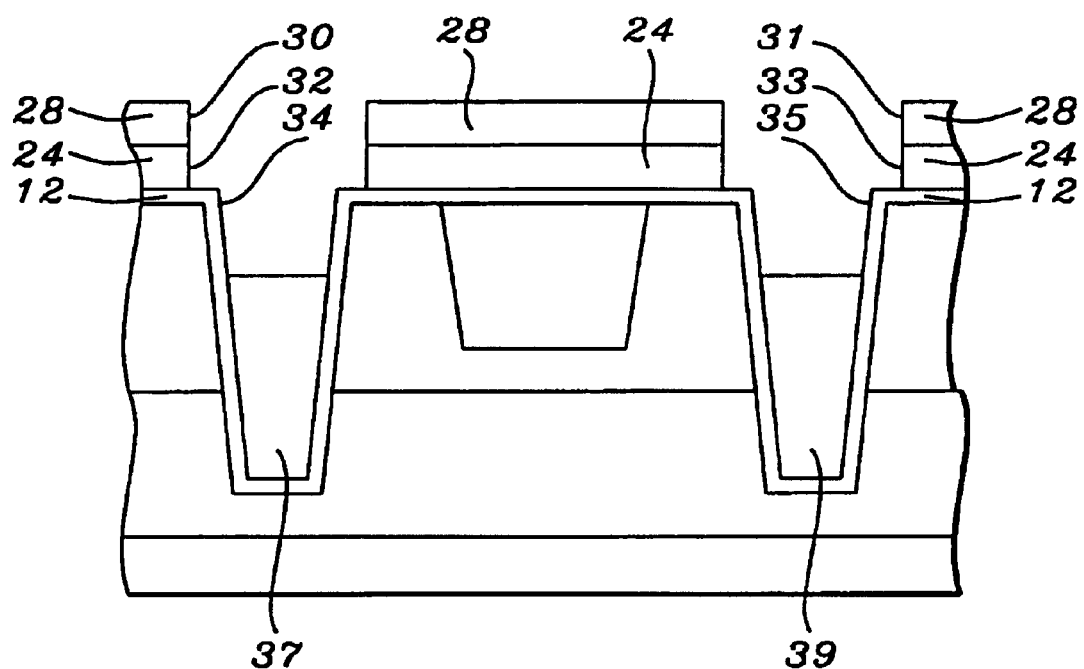

Referring next to FIG. 8a, there is shown a schematic drawing of the fabrication of FIG. 7 wherein a dielectric layer in the form of an oxide (12) has now been conformally formed on the upper surface of the substrate to a thickness of between approximately 30 and 100 angstroms. On the upper surface of the substrate over the double well the oxide will serve as a gate oxide for the gate of the access transistor, whereas on the sidewalls (14) and bottoms (15) of the trenches, it will serve as a capacitor dielectric to separate the two capacitor plates. A layer of photosensitive material (16), such as a photoresistive material, has then been deposited over the gate oxide and within the trench, whereafter a partial exposure and development of said medium has allowed the removal of a portion of said material above said trench openings, leaving a portion still remaining within said trench (20 & 21). The partial removal of said photosensitive material within each of said trenches exposes, thereby, a portion of the gate oxide (22 & 23) covering an upper portion of each trench sidewall within the upper well of the double well, allowing said portions to be subsequently removed. The removal of this portion of the capacitor dielectric is an important part of the present invention since it will eventually allow a direct and efficient contact between the source of the access transistor and the capacitor plate within the trench. An alternative method of exposing gate oxide on the upper portion of the capacitor trench is shown in the schematic drawing of FIG. 8b, wherein a layer of bottom anti-reflective coating (BARC), an organic photosensitive medium, is first applied (24) over the dielectric layer (12) on the substrate surface so as to also fill each capacitor trench. A layer of a second photosensitive medium (28) is then deposited over the BARC, the second medium being capable of exposure by radiation of a frequency that does not expose the BARC. The second medium is then developed and removed over each trench opening (30 & 31) and the BARC is partially etched back (32 & 33) by an $O_2$ dry etch, to leave a residue in each trench (37&39) and expose an upper region of the dielectric layer covering the trench walls (34 & 35). All other reference numerals are the same as in FIGS. 6 and 7.

Figure 9:
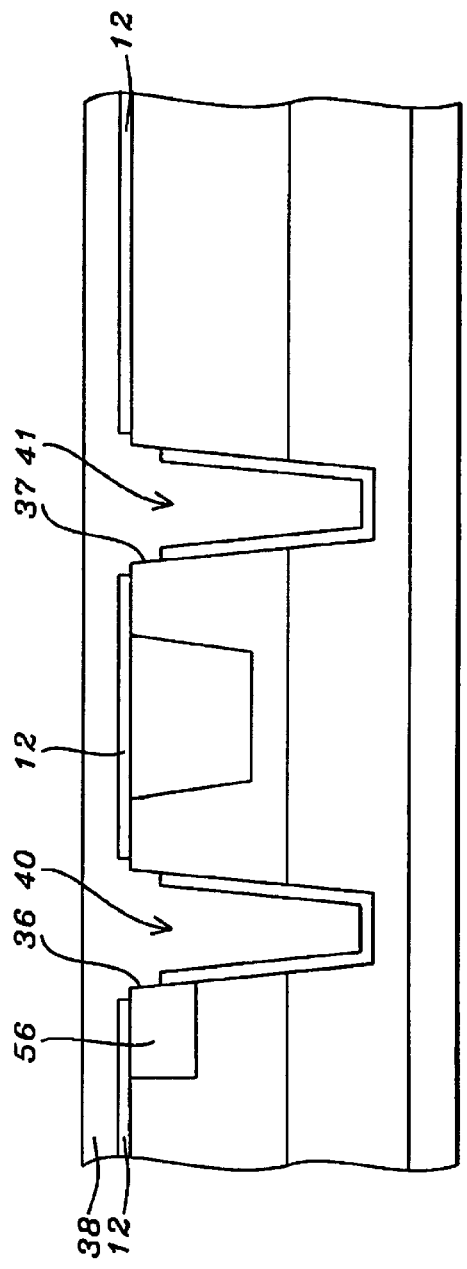

Referring now to FIG. 9, there is shown a schematic illustration of the fabrication of FIG. 8a wherein the dielectric layer over the upper walls of the trench has been etched away (36& 37), the photosensitive layer has been removed and a layer of conductive material, which in this embodiment is a polysilicon layer (38) has been deposited to a thickness of between approximately 1000 and 5000 angstroms over the gate oxide (12), also filling each trench completely (40 & 41). It is to be noted that the layer makes electrical contact with the substrate at (36) and (37), the area of the trench walls from which the capacitor dielectric has been removed. It is further noted that a region behind this area (56) becomes doped by autodiffusion of N-type dopant ions from the polysilicon layer within the trench to ultimately provide a conducting channel between the capacitor bottom plate (see FIG. 10) and the transistor which is to be fabricated. The polysilicon layer may be smoothed by a chemical mechanical polishing (CMP) to facilitate a subsequent interlayer dielectric deposition.

Figure 10:
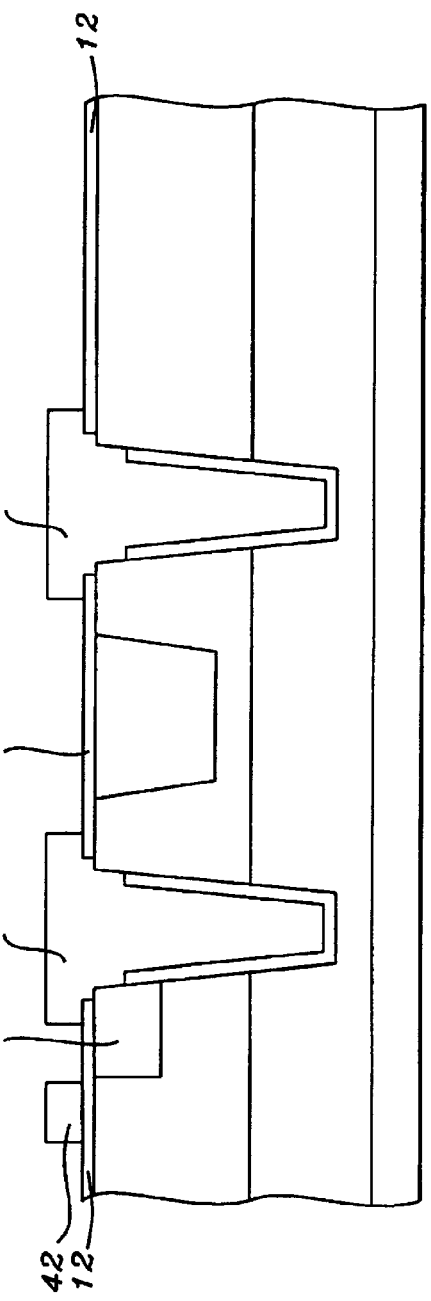

Referring now to FIG. 10, there is shown a schematic drawing of the fabrication of FIG. 9 wherein said polysilicon layer, (38) in FIG. 9, has been patterned and etched by a photolithography process (not shown) to produce both a gate-electrode/word-line formation (42) for the access transistor of the memory cell and to complete the bottom plate formation of each trench capacitor (44) & (45). It is also noted that the STI region (2) now electrically isolates the capacitor bottom plates (44) & (45) from each other. It is a significant advantage of the method of this invention that the single conductive layer (38) will serve both as a bottom plate for the capacitors, whose top plates are the sidewalls and bottoms of the trenches extending into the deep N-well, and to form gate electrodes for the access transistors.

Figure 11:
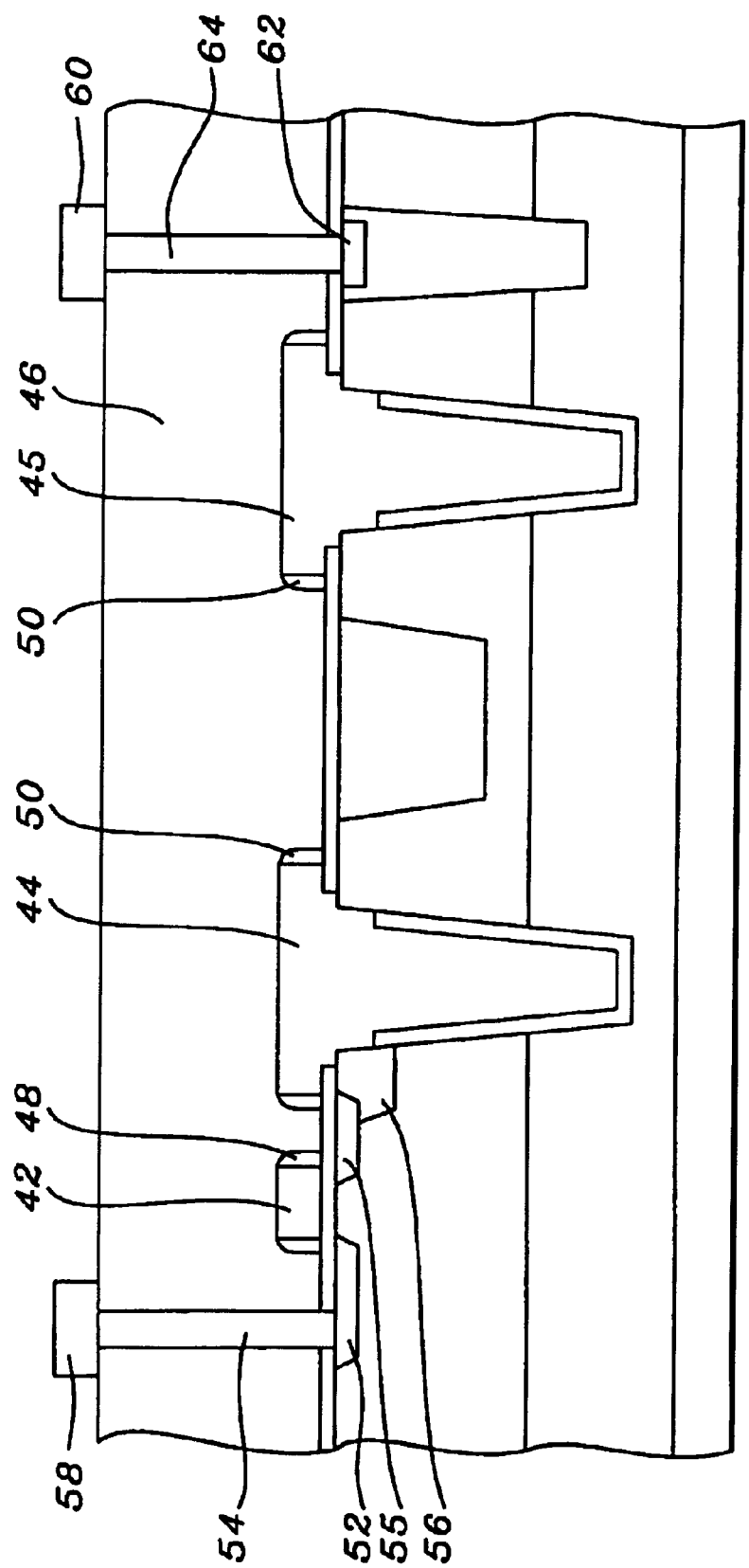

Referring now to FIG. 11, there is shown a schematic drawing of the completed transistor/capacitor memory cell and the adjacent memory cell, both covered by an interlayer dielectric (46) which can be a layer of $SiO_2$ deposited to a thickness of between approximately 5000 and 10,000 angstroms. The gate/word-line polysilicon formation (42) has been provided with lateral spacers (48) and the polysilicon capacitor bottom plates (44 & 45) have been similarly provided with lateral spacers (50). An access transistor, which in this embodiment is a MOSFET has been formed by the implantation of N-type lightly doped (NLDD) drain (52) and source (55) regions at an implantation density of between approximately $10^{13}$ and $10^{14}$. $P_{31}$ ions/cm$^{-2}$ and a bit line contact (54) has been formed through the ILD to form a conducting contact to the drain (52) of said transistor. The source (55) of said transistor is connected to the polysilicon bottom plate (44) of the storage capacitor through a heavily N-doped capacitor contact (56) which is doped by autodiffusion from the polysilicon capacitor bottom plate (44) to a density of between approximately $10^{19}$–$10^{20}$ ions/cm$^3$. Also shown are two portions of a first metallization deposited on the ILD. A first metallized bit line (58) electrically contacts the connection (54) to the transistor drain (52) and a second metallized line (60), provides a reference potential, Vcc/2, for the deep N-well (6) through a connecting line (64) to a heavily N-doped region (62) in a secondary N-well (61). It is through this highly conductive contact that the top plates (the portion of the trench sidewall of each capacitor within the same deep N-well) of all of the storage capacitors acquire a common potential. In general, each trench capacitor is connected to an access transistor. The trench capacitor with plate electrode (45) is not shown with its access transistor so that the deep N-well pick-up (61) can be shown. This pick-up produces an electrical contact to the deep N-well which, in turn, allows the top plates of the capacitors to be placed at a common potential. It is also understood that other ion species and densities may be used to produce the same conductivity types.

Figure 12:
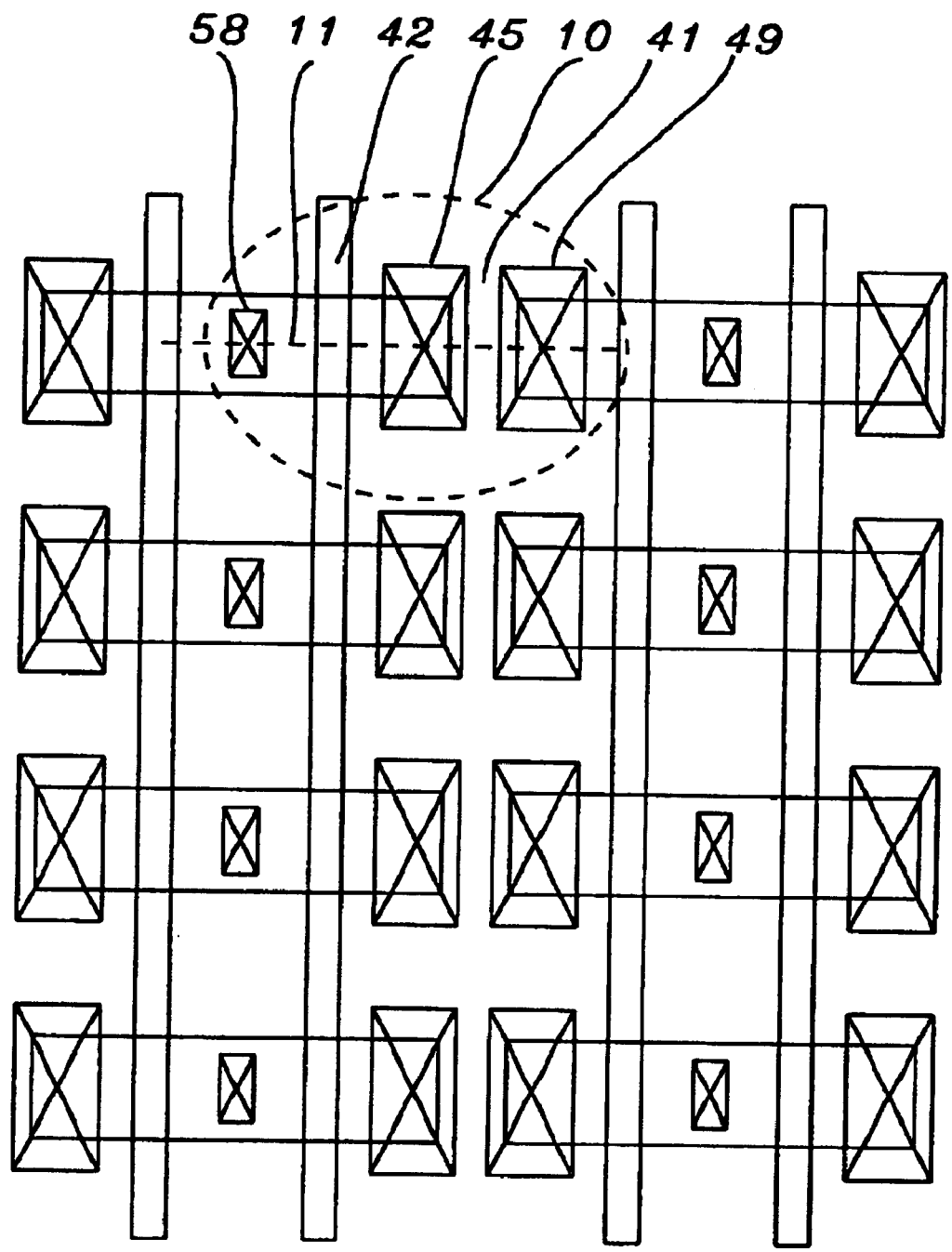
FIG. 12 shows an overhead view of a plurality of such DRAM memory cells, indicating more clearly their geometric topography and the intersection of word lines and bit lines.

Referring finally to FIG. 12, there is shown an overhead schematic diagram of the arrangement of the bit-line contacts to the drains of the access transistors and the word lines to the gates of the access transistors. The dashed circled region (10) corresponds to the portion of the fabrication that has been schematized in cross-section in the preceeding FIGS. 1–6. The plane of the cross-section in FIGS. 1–6 corresponds to the horizontal dashed line (11) passing through (10). The two trench capacitors are shown as (45) and (49) and the STI region is indicated as (41). The access transistor for capacitor (49) was not shown in FIG. 11 and the deep N-well pick-up ((61) in FIG. 11) is not shown in this figure. The bit line contact is (58), the word line (42) is shown in FIG. 6 in cross-section also as (42).

As is understood by a person skilled in the art, the preferred embodiment of the present invention is illustrative of the present invention rather than limiting of the present invention. Revisions and modifications may be made to methods, materials, structures and dimensions employed in the present method of fabricating DRAM memory cell structures, while still providing a method for fabricating DRAM memory cell structures, in accord with the spirit and scope of the present invention as defined by the appended claims.

What is claimed is:

1. A method for fabricating a DRAM cell array comprising:

providing a semiconductor substrate;

forming a shallow isolation trench within said substrate;

filling said shallow isolation trench with a dielectric material and rendering the trench surface coplanar with the substrate surface;

forming within said substrate a double well comprising a shallow upper well of a first dopant type substantially contained within a deeper lower well of a second dopant type, said isolation trench being now being contained within the shallow well thereof;

forming within said double well at least two adjacent DRAM cells, said cells being separated by said isolation trench and each cell including a storage trench capacitor and adjacent access transistor, said DRAM cell formation further comprising:

forming within the double well a capacitor trench, said capacitor trench having a trench opening in the surface of the double well, sidewalls extending through said upper well and into said lower well and a bottom in said lower well, the trench bottom and the portion of the sidewall within the lower well forming a first capacitor plate and said trench being at least partially surrounded by said shallow isolation trench;

forming a layer of dielectric material over the upper surface of the double well, to form thereon a transistor gate dielectric, said layer also conformally covering the sidewall and bottom of said trench, and forming, thereon, a capacitor dielectric;

removing a portion of said dielectric layer to expose an upper region of the sidewall of said trench;

forming a conducting layer over the dielectric layer, the conducting layer also conformally filling the trench;

patterning said conducting layer to form a gate electrode for said access transistor adjacent to said trench opening on the side of said opening opposite to said isolation trench, a portion of said conducting layer remaining within the capacitor trench forming a second plate for said capacitor;

forming source and drain regions within the upper well of said double well beneath the gate electrode, the source region being electrically connected to the second capacitor plate through an autodiffused conducting channel extending to said source from the exposed region of the trench sidewall.

2. The method of claim 1 wherein the formation of the double well further comprises:

forming within said semiconductor substrate a deep well, which is a region deeply implanted with ions of a first dopant type to a first ion density;

forming within said deep well a shallow well which is a region less deeply implanted with ions of a second dopant type and to a second ion density, said shallow well being substantially contained within the deep well.

3. The method of claim 1 wherein the patterning of said conducting layer further comprises:

removing a portion of said conductive material to form two disjoint remaining portions, one of said remaining portions forming a transistor gate electrode and the other of said portions, which includes the portion conformally filling the trench, forming a capacitor bottom plate electrode.

4. The method of claim 1 wherein the dielectric layer is removed from the upper region of the trench sidewall by a method further comprising:

forming a layer of photosensitive material over the surface of said dielectric layer, said photosensitive layer also filling the interior of said trench;

patterning said layer by exposure to radiation;

removing a portion of said photosensitive layer to form an opening into said trench, said opening extending into the upper portion of said trench and exposing the dielectric layer covering said portion of the trench;

removing the exposed portion of the dielectric layer;

removing all remaining portions of the photosensitive layer.

5. The method of claim 1 wherein the dielectric layer is removed from the upper region of the trench sidewall by a method further comprising:

forming a layer of bottom anti-reflective coating (BARC) material over the surface of said dielectric layer, said layer also filling the interior of said trench;

forming a layer of photosensitive material over said BARC layer;

patterning said photosensitive layer by exposure to radiation;

removing a portion of said photosensitive layer over the trench opening, to expose the BARC layer beneath it:

removing a portion of the BARC layer within the trench sufficient to expose a portion of the dielectric layer;

removing the exposed portion of the dielectric layer;

removing all remaining portions of the photosensitive layer and BARC layer.

6. The method of claim 1 wherein the semiconductor substrate is a silicon substrate.

7. The method of claim 6 wherein the first dopant type ions are N-type ions.

8. The method of claim 7 wherein the N-type ions are deposited to a density of between approximately $10^{16}$ and $10^{18}$ ions/cm$^3$.

9. The method of claim 6 wherein the second dopant type ions are P-type ions.

10. The method of claim 9 wherein the P-type ions are deposited to a density of between approximately $10^{16}$ and $10^{18}$ ions/cm$^3$.

11. The method of claim 6 wherein the dielectric layer is a layer of SiO$_2$ formed to a thickness of between approximately 30 and 100 angstroms.

12. The method of claim 6 wherein the conducting layer is a layer of doped polysilicon deposited to a thickness of between approximately 1000 and 5000 angstroms.

13. The method of claim 12 wherein the polysilicon is doped with N-type ions to a density of between $10^{20}$ and $10^{21}$ ions/cm$^3$.

14. The method of claim 6 wherein the transistor is formed by implanting lightly doped source and drain regions with N-type ions.

15. The method of claim 14 wherein the N-type ions are implanted to a density of between approximately $10^{18}$ and $10^{19}$ ions/cm$^3$.

16. The method of claim 6 further comprising the formation of an electrical contact to the bottom plate of said capacitors by means of an electrical connection to the deep N-well.

* * * * *